United States Patent
Suh et al.

(10) Patent No.: US 9,653,630 B2
(45) Date of Patent: May 16, 2017

(54) QUANTUM DOT SOLAR CELL PERFORMANCE WITH A METAL SALT TREATMENT

(71) Applicant: Samsung Electronics Co., Ltd., Suwon-si, Gyeonggi-do (KR)

(72) Inventors: Su Kyung Suh, Somerville, MA (US); Dong-Kyun Ko, Somerville, MA (US); Vladmir Bulovic, Lexington, MA (US); Moungi Bawendi, Cambridge, MA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/270,141

(22) Filed: May 5, 2014

(65) Prior Publication Data
US 2016/0035919 A1    Feb. 4, 2016

Related U.S. Application Data

(60) Provisional application No. 61/900,891, filed on Nov. 6, 2013.

(51) Int. Cl.
*H01L 27/146* (2006.01)
*H01L 31/0352* (2006.01)
(Continued)

(52) U.S. Cl.
CPC .. *H01L 31/035218* (2013.01); *H01L 31/0324* (2013.01); *H01L 31/0336* (2013.01);
(Continued)

(58) Field of Classification Search
CPC ......... H01L 27/14603; H01L 27/14687; H01L 27/14641; H01L 27/14647; H01L 27/14652; H01L 31/035218; H01L 31/072
See application file for complete search history.

(56) References Cited

U.S. PATENT DOCUMENTS 7,923,801 B2 *  4/2011  Tian ................. H01L 27/14603
                                                  257/440
7,947,202 B2    5/2011  Holliday
(Continued)

OTHER PUBLICATIONS

Tan, Furui et al., "Nanotetrapods:quantum dot hybrid for bulk heterojunction solar cells", Nanoscale Research Letters, 2013, 8:434.

(Continued)

*Primary Examiner* — Kyoung Lee
*Assistant Examiner* — Joannie A Garcia
(74) *Attorney, Agent, or Firm* — GSS Law Group (57) ABSTRACT

The performance of lead sulfide quantum dot (QD) photovoltaic cells is improved by exposing a QD layer to a solution containing metal salts after the synthesis of the QDs is completed. The halide ions from the salt solution passivate surface lead (Pb) sites and alkali metal ions mend Pb vacancies. Metal cations and halide anions with small ionic radius have high probability of reaching QD surfaces to eliminate surface recombination sites. Compared to control devices fabricated using only a ligand exchange procedure without salt exposure, devices with metal salt treatment show increases in both the form factor and short circuit current of the PV cell. Some embodiments comprise a method for treatment of QDs with a salt solution and ligand exchange. Other embodiments comprise a photovoltaic cell having a QD layer treated with a salt solution and ligand exchange.

22 Claims, 9 Drawing Sheets

(51) Int. Cl.
*H01L 31/032* (2006.01)
*H01L 31/0336* (2006.01)
*H01L 31/18* (2006.01)
*H01L 31/0384* (2006.01)
*H01L 31/072* (2012.01)

(52) U.S. Cl.
CPC ........ *H01L 31/0384* (2013.01); *H01L 31/072* (2013.01); *H01L 31/186* (2013.01); *Y02E 10/50* (2013.01); *Y02P 70/521* (2015.11)

(56) References Cited

U.S. PATENT DOCUMENTS

| | | | |
|---|---|---|---|
| 9,324,562 B1 | 4/2016 | Luther et al. | |
| 2009/0152664 A1* | 6/2009 | Klem | H01L 27/14603 257/440 |
| 2010/0000607 A1 | 1/2010 | Hanley | |

OTHER PUBLICATIONS

Zharghami, M.H. et al., "p-Type PbSe and PbS Quantum Dot Solids Prepared with Short-Chain Acids and Diacids", ACS Nano, vol. 4 No. 4, 2010, pp. 2475-2485.

\* cited by examiner

Fig. 1

| | |
|---|---|
| Glass | 111 |
| First electrode | 110 |
| Transparent semiconductor layer | 108 |
| QD layer | 134 |
| Interfacial layer | 104 |
| Second electrode | 102 |

QUANTUM DOT SOLAR CELL PERFORMANCE WITH A METAL SALT TREATMENT

CROSS REFERENCE

This application claims priority to U.S. Provisional Patent Application No. 61/900,891 filed Nov. 6, 2013, titled "Improving the Quantum Dot Solar Cell Performance Using Metal Salt Treatment", incorporated herein by reference in its entirety.

TECHNICAL FIELD

An embodiment relates in general to a photovoltaic cell for generating electrical power, and more particularly, to a photovoltaic cell including quantum dots treated with a salt to improve a value of power conversion efficiency.

BACKGROUND

A photovoltaic (PV) cell converts energy in light incident upon a light-absorbing layer in the PV cell to electrical current and voltage. A single PV cell with a light-absorbing layer fabricated from silicon has an open-circuit output voltage of about 0.5 to about 0.7 volt cell and an output current related to an amount of surface area available for absorbing incident light, cell temperature, and other factors. Two or more PV cells may be connected together electrically to form a PV module having higher output voltage and more output current than a single PV cell. For example, PV cells may be connected to one another with series and parallel electrical connections to form a PV module having an electrical output power of about 40 watts in a mechanical support structure approximately 25 inches long by 20 inches wide by 2 inches thick, with many other sizes and power ratings available for PV modules. A PV module may include different layers for protecting PV cells in the module from dirt, exposure to water, and mechanical stress, and may include electrical terminals for connecting the PV module to other PV modules or to an electrical load.

Silicon used in the production of PV cells may be subjected to high processing temperatures for refining and annealing raw materials and wafers. Alternative PV cell technologies are being explored which take advantage of lower processing temperatures, possibly saving energy during cell manufacture and permitting the use of low-cost manufacturing processes and materials that may be unable to withstand high processing temperatures. For example, PV cells having a light-absorbing layer including many small, colloidal semiconductor quantum dots (QDs) may reduce manufacturing costs significantly compared to PV cells made from silicon wafers sliced from a silicon boule or ribbon. QDs may be formed by wet chemistry methods in which approximately spherical nanoparticles of a light-absorbing compound such as lead sulfide (PbS) or another semiconductor compound are synthesized in a liquid solution and deposited as a granular thin film on a solid surface. QD synthesis and deposition may be performed at or near room temperature, much lower than temperatures for manufacturing silicon wafers.

The band gap energy of a quantum dot (QD) is related to the size of the QD. The size of a QD may be represented by a linear dimension of the QD, for example a diameter of the QD. An individual QD in a QD film for a PV cell may have a diameter in a range from a few nanometers to a few tens of nanometers. The power conversion efficiency of a PV cell may be maximized at a selected wavelength of incident light by controlling the size of the QDs forming the light-absorbing layer in the PV cell.

Long-chain ligands extending from the surface of a QD may act as electrical insulators that reduce the mobility of charge carriers between QDs in a light-absorbing layer in a PV cell. Long-chain ligands bonded to QDs may therefore reduce the electrical power conversion efficiency of a PV cell, where power conversion efficiency $\eta_p$ may be defined as the product of open-circuit voltage $V_{oc}$, short-circuit current $J_{sc}$, and fill factor FF as shown in equation (1).

$$\eta_p = V_{oc} \times J_{sc} \times \text{FF} \tag{1}$$

Fill factor may be defined as the ratio of the maximum power from the PV cell to the product of $V_{oc}$ and $J_{sc}$ as shown in equation (2).

$$\text{FF} = (I_{mp} \times V_{mp})/(V_{oc} \times J_{sc}) \tag{2}$$

$I_{mp}$ refers to the current output from the PV cell at the cell's maximum output power and $V_{mp}$ refers to the output voltage at maximum output power.

Exchanging long-change ligands for shorter ligands may improve the power conversion efficiency of a PV cell having QDs in a light-absorbing layer. Ligand exchange may be performed repeatedly during synthesis or during deposition of QDs to replace long-chain ligands with shorter ligands throughout the volume of material included in each QD. Ligand exchange may reduce the volume of a QD, thereby affecting electrical parameters of a device incorporating QDs, and may cause some kinds of defects that interfere with energy conversion and with electrical current flow between QDs in a QD film. A defect may arise from abrupt termination of atoms on the surface of a QD or from an undesirable atomic ratio.

Performing ligand exchange during the QD deposition process may increase uncertainty in parameters related to performance of a finished PV cell, lengthen manufacturing time, and increase manufacturing cost for PV cells. Defects in a QD may degrade one or more of the parameters $J_{sc}$, $V_{oc}$, and FF and may reduce the power conversion efficiency and an amount of electrical power output from a PV cell. PV cells could be manufactured at lower cost for a specified power conversion efficiency compared to previously known methods if defects in QDs could be repaired after deposition of the QDs on a substrate.

SUMMARY

An example of a method embodiment includes depositing a quantum dot film on a substrate layer of a photovoltaic cell. After depositing the quantum dot film, defects in the quantum dot film are repaired by treating the quantum dot film with a salt solution and a ligand exchange is performed on the quantum dot film.

An example of an apparatus embodiment includes a photovoltaic cell for generating electrical power. The example of a photovoltaic cell includes a first transparent outer layer, a first electrode adjacent the first transparent outer layer, and a transparent semiconductor layer electrically connected to the first electrode. The photovoltaic cell further includes a quantum dot layer forming a P-N junction with the transparent semiconductor layer. The quantum dot layer includes at least one quantum dot film modified by washing the at least one quantum dot film with a salt solution and by ligand exchange. The photovoltaic cell further includes an interfacial layer between the quantum dot layer and a second outer layer.

An example of another embodiment includes a photovoltaic cell manufactured by the process of synthesizing a solution of quantum dots stabilized by long-chain ligands, depositing a quantum dot film on a transparent semiconductor layer, repairing defects in the quantum dot film by exactly two salt treatments of the quantum dot film, and performing ligand exchange on the quantum dot film. Each of the exactly two salt treatments includes covering the quantum dot film with a salt solution for a selected time duration and removing excess salt solution from the quantum dot film.

BRIEF DESCRIPTION OF THE DRAWINGS

Accompanying drawings show one or more embodiments; however, the accompanying drawings should not be taken to limit the invention to only the embodiments shown. Various aspects and advantages will become apparent upon review of the following detailed description and upon reference to the drawings in which.

DESCRIPTION

The power conversion efficiency $\eta_p$ of a solar cell having a lead sulfide (PbS) light-absorbing QD layer is improved by a salt treatment and a ligand exchange treatment of the QD layer. An example of an embodiment includes depositing a QD film followed by a salt treatment and ligand exchange of the QD film. Deposition may be repeated until a QD layer having a preferred value of a thickness dimension has been formed, with at least one salt treatment and at least one ligand exchange intervening between each deposition. One salt treatment includes covering the most recently deposited QD film in a QD layer with a salt solution, then removing excess salt solution. Some embodiments include exactly two salt treatments of each QD film. Another example of an embodiment includes a PV cell including a light-absorbing layer comprising QD films subjected to two salt treatments and ligand exchange after deposition of each QD film in the QD layer.

Halide ions in the salt solution passivate lead (Pb) sites on the exterior surfaces of the QDs in a QD film. Alkali metal ions passivate surface chalcogen sites and/or mend Pb vacancies in the semiconductor crystalline structure. Simultaneous introduction of both positive and negative ion maintains charge neutrality of the QDs. In some embodiments, exposing the QD films to a metal salt solution is performed prior to a ligand exchange procedure in which metal cations and halide anions with small ionic radius have high probability of reaching the QD surface to eliminate surface recombination sites.

Compared to a control device fabricated by performing ligand exchange without at least one salt treatment of a deposited QD film, devices in accord with an embodiment show increases in both FF and $J_{sc}$, accompanied by a reduction in a crossover between light and dark current-voltage (J-V) characteristics. In contrast to processes requiring high temperatures for creating a p-n junction in a PV cell, for example for melting, annealing, or refining monocrystalline or polycrystalline silicon or for subsequent oxidation or diffusion processing of the silicon, a p-n junction in a PV cell in accord with an embodiment may be manufactured at approximately room temperature (25° C.). Embodiments are readily scalable to manufacturing single PV cells of almost any dimensions, unlike previously known PV cells made from silicon sliced from an ingot or ribbon.

Figure 1:
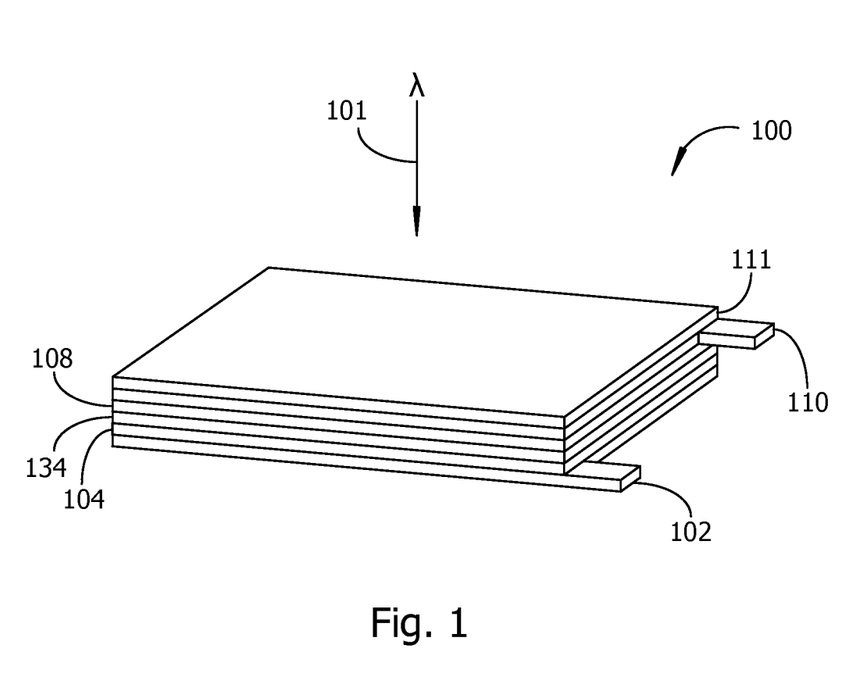
FIG. 1 is a simplified pictorial view of an example of a photovoltaic cell in accord with an embodiment.

An example of a PV cell in accord with an embodiment is represented in simplified pictorial form in FIG. 1. Some of the layers are shown in FIG. 1 with exaggerated thickness. When incident illumination 101, for example sunlight or artificial illumination, passes through a first outer layer 111 of the PV cell 100, a first electrode 110, a semiconductor layer 108, and is absorbed by a QD layer 134, a voltage is generated between the first electrode 110 and a second electrode 102. An interfacial layer 104 separates the QD layer 134 from a second outer layer 102. The example of a PV cell 100 in FIG. 1 is shown with a generally rectangular perimeter shape. In alternative embodiments of a PV cell, the generally rectangular perimeter shape may be replaced by square, circular, semicircular, irregular, or other perimeter shapes. The various layers in the PV cell 100 may be approximately planar as suggested in FIG. 1 or may alternatively be formed with curved surfaces to concentrate incident illumination on light-absorbing layers in the PV cell.

Figure 2:
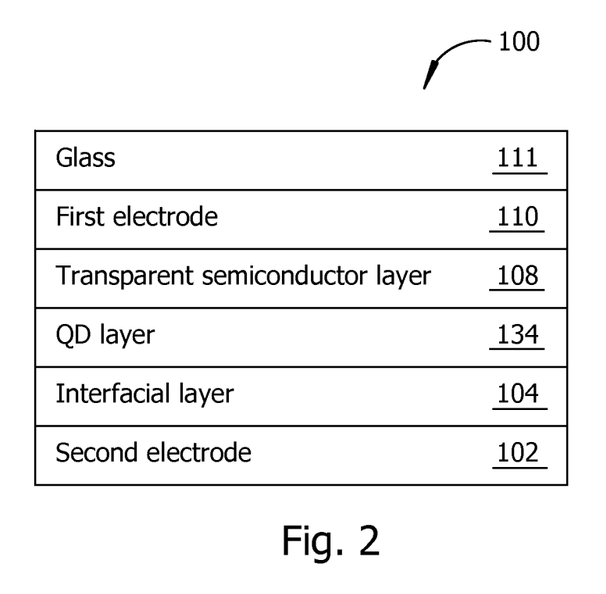
FIG. 2 is a block diagram representing layers in the PV cell of FIG. 1.

FIG. 2 shows examples of functions for layers in the PV cell 100 of FIG. 1. The first outer layer 111 protects other layers in a PV cell 100 from water, dirt, and mechanical damage. The first outer layer 111 is preferably transparent over a range of frequencies of incident illumination 101 to be converted to electrical power. Examples of materials for the outer layer 111 include, but are not limited to, glass, polycarbonate, and acrylic. The first electrode 110 may be made from an optically transparent electrical conductor such as indium tin oxide (ITO). Light transmitted through the first electrode 110 passes into a semiconductor substrate layer 108 in electrical contact with the first electrode 110. The semiconductor substrate 108 may be made from a transparent N-type semiconductor material, for example zinc oxide (ZnO) or titanium oxide. The first electrode 110 may operate as a cathode when the PV cell is electrically connected to other PV cells in a PV module.

A semiconductor P-N junction is formed between the semiconductor substrate layer 108 and a light-absorbing layer of quantum dots 134 deposited on the substrate layer 108. QDs are synthesized in a liquid solution to a preferred size corresponding to a preferred band gap before being deposited in the QD layer 134 on the substrate 108. QDs are made stable in a QD solution by long-chain ligands extending from the QDs. Examples of ligands in an embodiment include, but are not limited to: ethanedithiol (EDT); 1,2 benzenedithiol (BDT); 1,3 benzenedithiol; 1,4 benzenedithiol; and mercaptopropionic acid (MPA). The size of a QD, for example a length, width, and thickness of a QD or a diameter of an approximately spherical QD, a number of QDs per unit area, and other parameters such as the band gap of the QDs may be precisely controlled during the synthesis of the QDs. After QDs are deposited in a QD film, excess QD solution may be removed from the substrate and QD film by spinning the substrate. Alternatively, a QD film may be formed by dipping a substrate in a PbS solution and removing the substrate from the solution. A QD deposited in a QD film on a substrate preferably retains the optical and electrical properties of a QD suspended in solution before deposition begins. QDs having different band gaps may be deposited to form a PV cell adapted for converting different wavelengths of incident illumination.

An interfacial layer 104, for example a layer comprising one or more oxides of molybdenum referred to as MoOx, is adjacent the QD layer 134. A second electrode in electrical contact with the interface layer 104 optionally comprises an arrangement of electrical conductors made from gold (Au). The second electrode 102 is arranged as a second outer layer of the PV cell 100 and may function as an anode.

Figure 3:
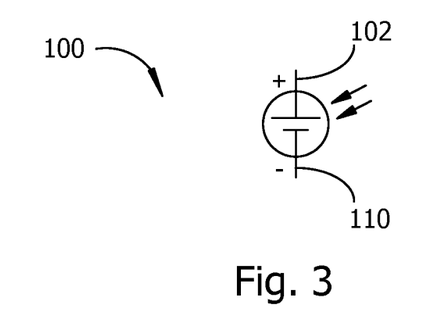
FIG. 3 is a schematic symbol of a PV cell in accord with an embodiment.
Figure 4:
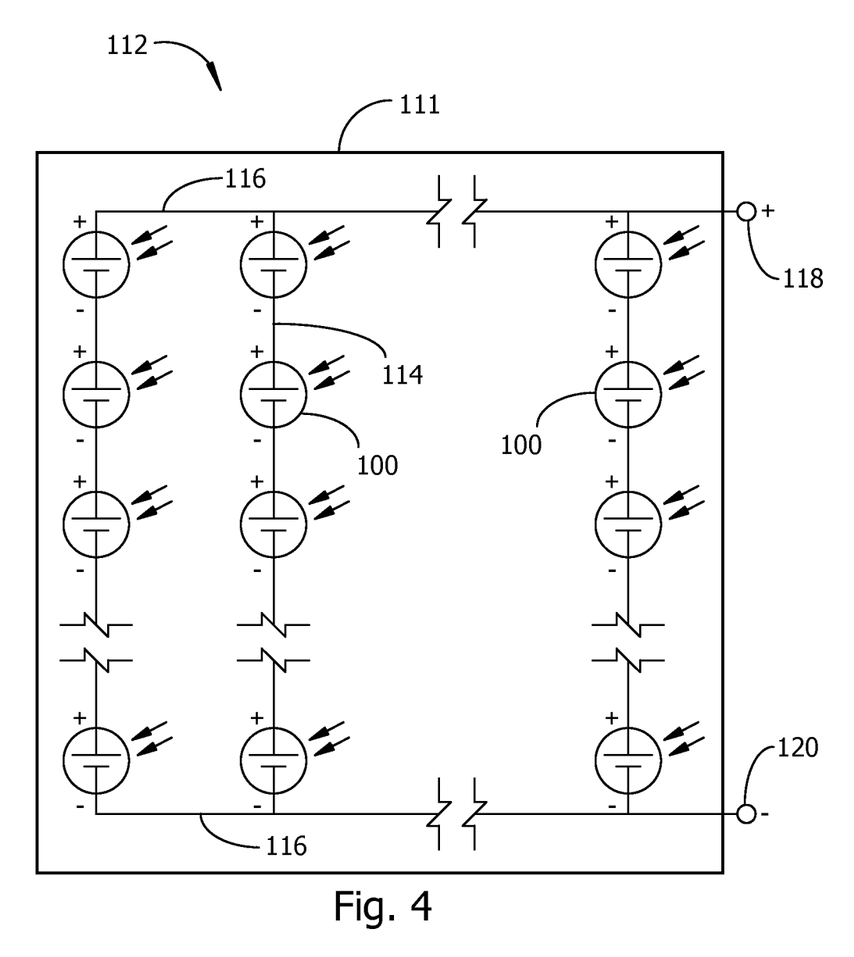
FIG. 4 is a schematic diagram of a PV module comprising a plurality of PV cells electrically connected to one another with serial and parallel electrical connections.

FIG. 3 represents one PV cell in accord with an embodiment by a schematic symbol. FIG. 4 shows an electrical schematic for an example of a PV module 112 comprising a plurality of individual PV cells 100 electrically connected to one another by series electrical connections 114 and parallel electrical connections 116 to combine the power output of the individual PV cells at a positive PV module output terminal 118 and a negative PV module output terminal 120. The PV module 112 provides mechanical support for the interconnected PV cells 100 and protects the PV cells from mechanical damage and exposure to water, dust, dirt, and other contaminants. An outer glass layer 111 corresponding to the first outer layer 111 for the example of a PV cell 100 in FIG. 1 may cover more than one of the PV cells 100 in the example of FIG. 4, thereby defining a number of PV cells included in one PV module 112.

Figure 5:
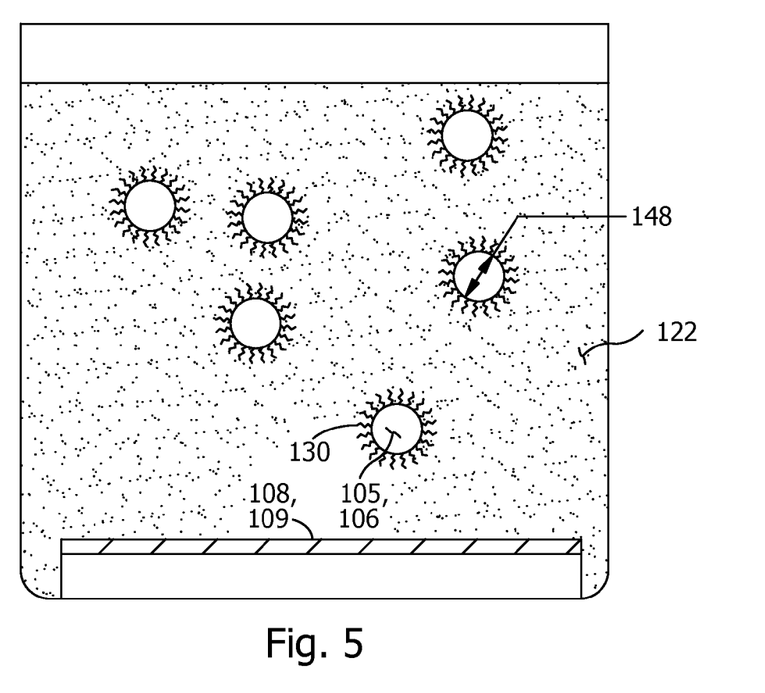
FIG. 5 is a side view of a simplified representation of a substrate layer for a PV cell exposed to a solution comprising nanoparticles with long-chain ligands extending from the surface of each nanoparticle in solution.

FIGS. 5-10 illustrate examples of an embodiment manufactured from nanoparticles synthesized in a QD solution, deposited from the QD solution to form at least one QD film on a substrate, and subjected to salt treatment and ligand exchange treatment after deposition of each QD film. QDs may be synthesized from a chalcogenide such as lead sulfate (PbS) or lead selenide (PbSe). In the figures, the QDs 106 and long-chain ligands 130 are drawn with exaggerated size compared to the substrate 108 to emphasize differences in QD spacing in the granular QD film before and after each of the two salt treatments. In the example of FIG. 5, a substrate 108 having a surface 109 upon which a QD film is to be deposited is covered on at least one side by a liquid QD solution 122 containing suspended nanoparticles 105, for example a solution of PbS. Each of the approximately spherical nanoparticles 105 represents a QD 106 having long-chain ligands 130 extending outward from the QD. Synthesis of the nanoparticles is complete when the nanoparticles achieve a preferred size, for example a minimum preferred average value for a diameter 148 corresponding to a preferred value of band gap. Alternatively, the size of a QD may correspond to a preferred minimum, maximum, or average value of another linear dimension of the QD. A preferred size may be determined by measurements on a completed PV cell, for example a size that gives a maximum value for $J_{sc}$ or a maximum value for $\eta_p$ at a selected wavelength or intensity of incident illumination.

Figure 6:
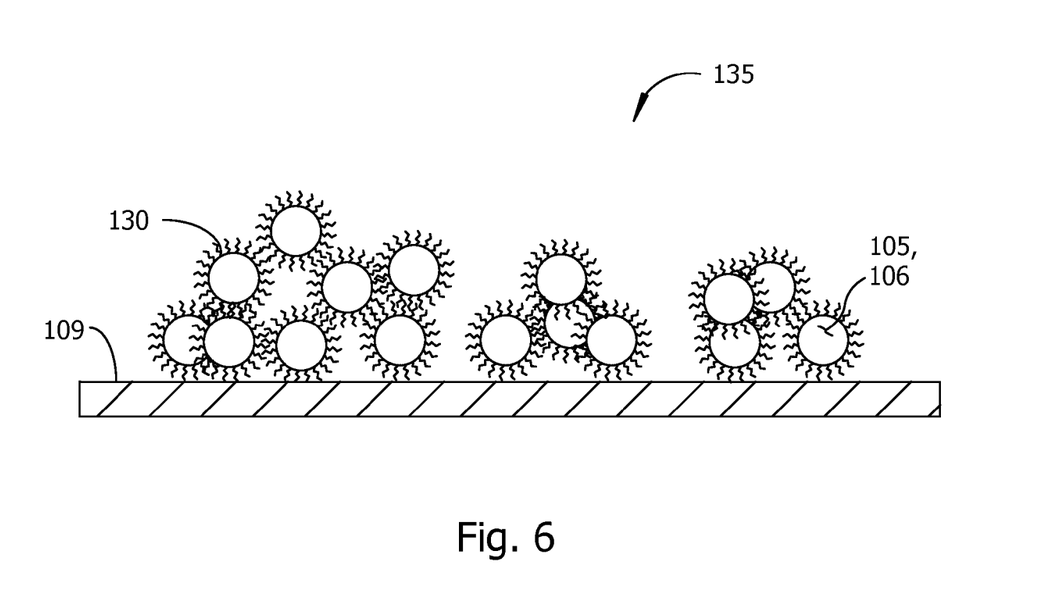
FIG. 6 is a side view of a QD film deposited on a surface of a substrate layer for a PV cell, in which gaps between QDs represent examples of defects which may reduce power conversion efficiency.

FIG. 6 shows an example of a granular QD film 135 comprising nanoparticle QDs 106 with long-chain ligands 130. The QD film 135 deposited on the surface 109 of the substrate layer 108 may include defects. Defects and long-chain ligands 130 reduce the power conversion efficiency $\eta_p$ of a PV cell, perhaps by interfering with the movement of charge carriers. While ligand exchange shortens electrically insulating ligands between QDs, minimizing the number and extent of defects in a QD layer is beneficial for improving power conversion efficiency.

Figure 7:
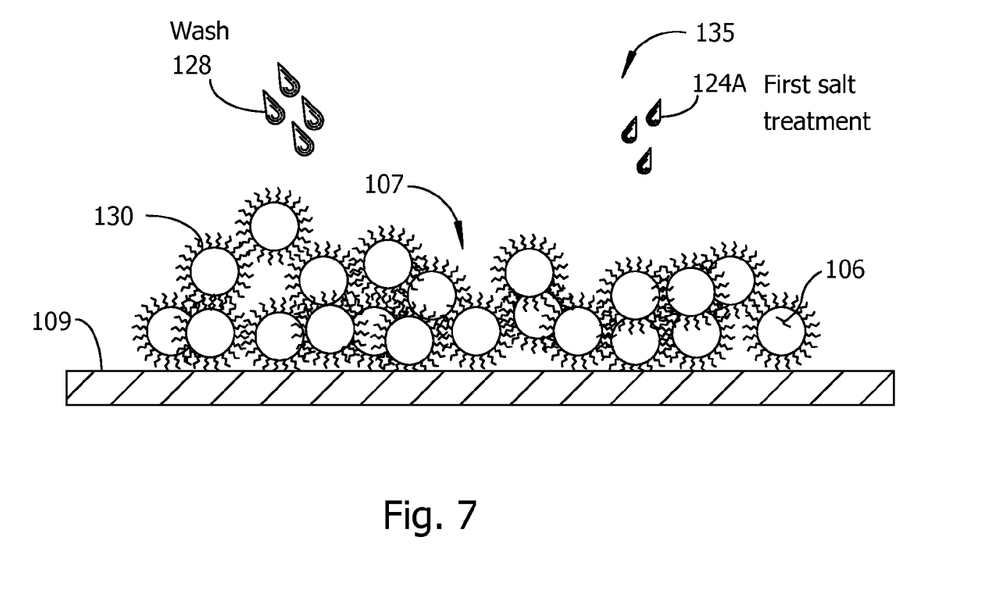
FIG. 7 illustrates the example of a QD film from FIG. 6 after some of the defects in the QD film have been eliminated by a first salt treatment.

Metal ion treatment and ligand exchange are performed after each deposition of a QD layer. A metal ion treatment includes covering a QD film with a liquid metal salt solution and then removing excess salt solution from the QD film. A metal ion treatment may also be referred to herein as a salt treatment. The first salt treatment 124A is applied after synthesis of the QDs in solution is finished and the QD film 135 has been deposited on the surface 109 of the substrate layer. Some of the excess salt solution may be removed by spinning the substrate. Excess salt solution may optionally be removed by washing the QD film 135 with a wash liquid 128, for example by washing with methanol. Wash liquid and salt solution may be removed by spinning the substrate. Methanol may optionally be replaced with another polar solvent.

Figure 8:
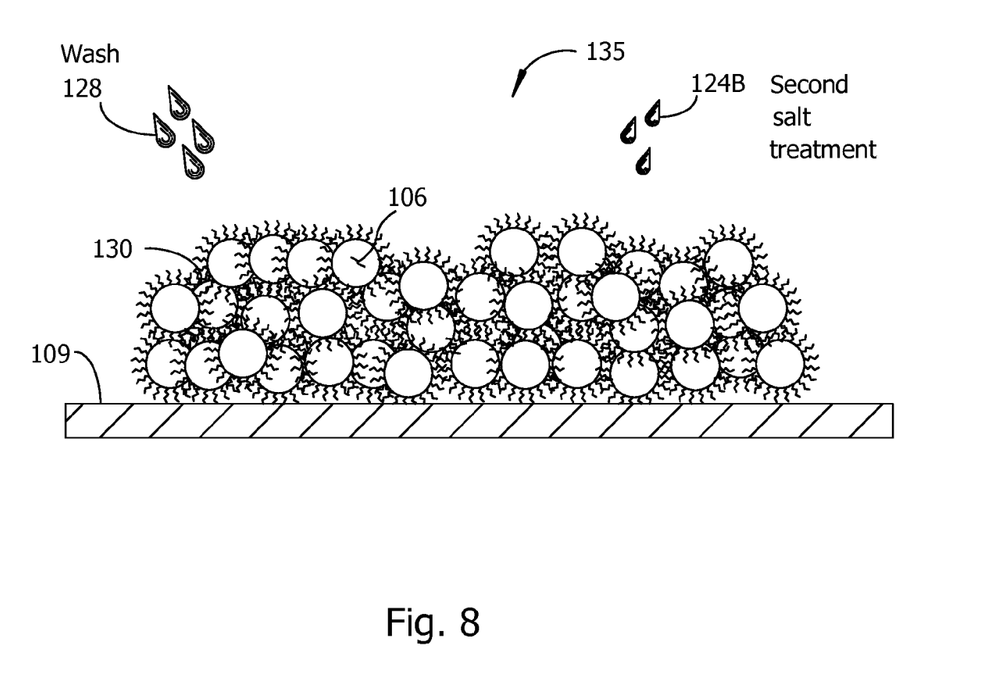
FIG. 8 illustrates the example of a QD film from FIGS. 6-7 after more defects in the QD film have been eliminated by a second salt treatment.

In some embodiments, more defects in the QD film 135 are repaired by a second salt treatment 124B as shown in FIG. 8. The second salt treatment 124B occurs after the first salt treatment 124A and before a deposition of another QD film. Two separate salt treatments, each treatment lasting for a selected time duration, for example 3 seconds, have been found to be more effective for repairing defects in a QD film 135 than one, possibly longer duration salt treatment. Furthermore, PV cells having a PbS light-absorbing layer as part of a P-N junction show a greater improvement in power conversion efficiency $\eta_p$ after two separate salt treatments than PV cells treated only once. Some embodiments preferably use exactly two salt treatments to repair defects in each QD film deposited in a QD layer for a PV cell. A salt treatment is concluded by removing excess salt solution from the QD film.

Figure 9:
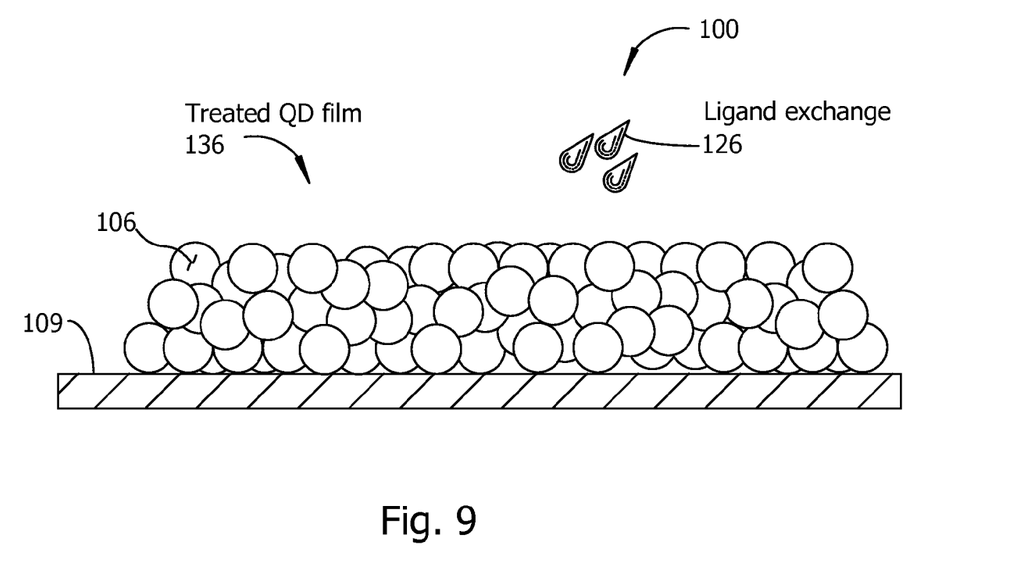
FIG. 9 is a simplified representation of the QD film of FIGS. 6-8 after treatment of the QD film to replace long-chain ligands extending from each QD with shorter ligands.

Long-chain ligands present on the exterior surfaces of the quantum dots 106 are shortened by exposing the QDs to a ligand exchange compound 126. Shortening the long-chain ligands increases power conversion efficiency $\eta_p$. However, unlike some methods previously known in the art, salt exposure, washing, and ligand exchange are performed for an embodiment only after the synthesis of the QDs is completed. FIG. 9 shows an example of a treated QD film 136 resulting from covering the QDs with long-chain ligands from the examples of FIGS. 6-8 with a ligand exchange compound 126 for a selected time duration, then removing excess ligand exchange compound by spinning the substrate and possibly by washing the QD film. In the example of FIG. 9, the QDs 106 are shown in close contact with one another, without intervening long-chain ligands and without gaps, cracks, or other defects that could impede movement of charge carriers in the PV cell 100.

Ligand exchange is preferably performed after a QD film is deposited and before another QD film is deposited. In some embodiments, ligand exchange is performed after a salt treatment. Alternatively, ligand exchange may be performed before a salt treatment. Ligand exchange may optionally be repeated until a photovoltaic cell has a selected minimum value of power conversion efficiency. Alternatively, ligand exchange may be repeated until a value for a short circuit current for the photovoltaic cell is greater than or equal to a selected minimum value of short circuit current.

Figure 10:
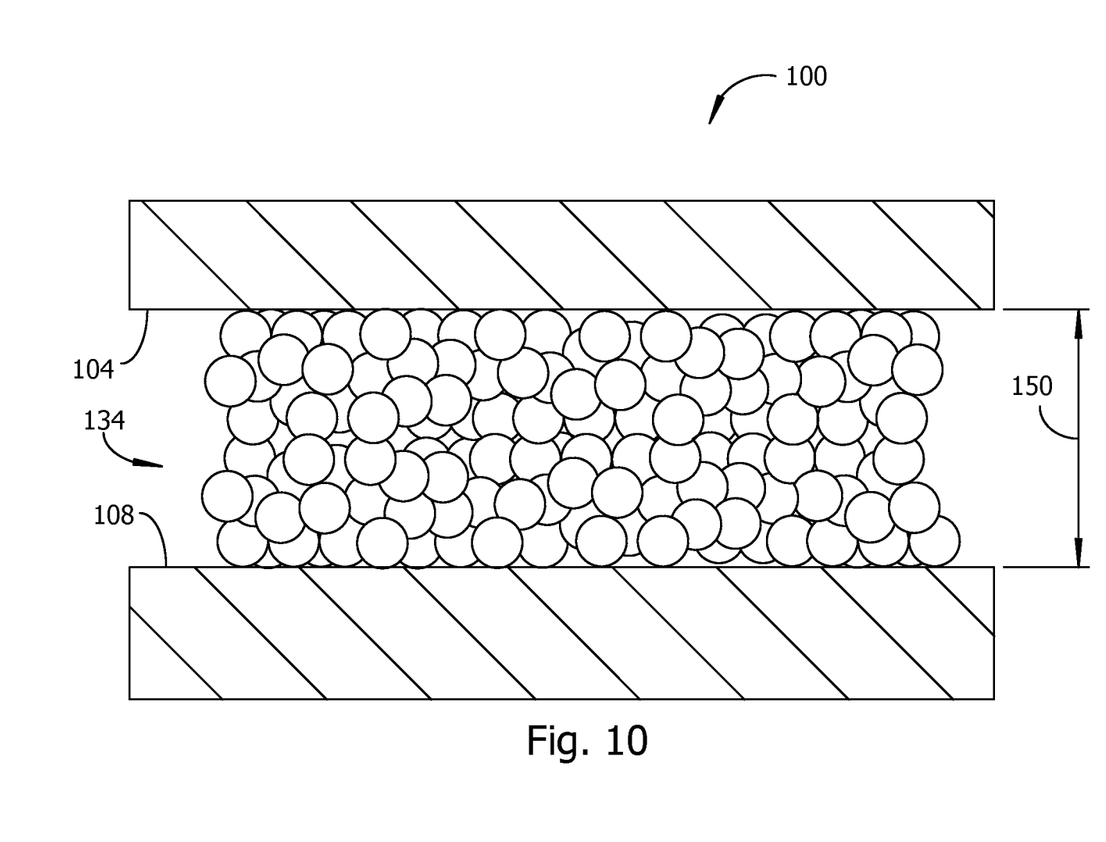
FIG. 10 illustrates a plan view of a layer of QDs between adjacent layers in a PV cell, where the QD layer comprises at least one QD film improved by two salt treatments and a ligand exchange.

FIG. 10 illustrates a side view of layers in a PV cell embodiment, including a QD layer 134 having a preferred thickness dimension 150 selected to achieve a preferred value of power conversion efficiency $\eta_p$ or alternately a preferred value of short circuit current $J_{sc}$. The QD layer 134 is shown with defects repaired and with the QD layer in good electrical contact with an interfacial layer 104 and a semiconductor layer 108 for efficient charge carrier mobility in the PV cell 100.

As an example of an embodiment, a layer of QDs were spincasted onto ZnO at 2000 revolutions per minute (RPM). The completed QDs were then covered with a salt solution (0.025M in methanol) applied over the QD layer. After 3 seconds, the solution was removed by spinning the PV cell and the QDs were washed with methanol to remove excess salt, followed by a second salt treatment. The QDs were then treated with 1,3 benzenedithiol (BDT) to exchange long-change oleic acid ligands on the QDs with shortened BDT ligands. Ligand exchange solution was then removed by washing. The combined steps of QD deposition, two salt treatments, and ligand exchange were repeated twelve (12) times in order to achieve a preferred measured performance of the PV cell.

The effects of salt treatment may be explained further with regard to Table 1 and FIG. 9. For the results shown in the examples of Table 1 and FIG. 9, oleic acid was exchanged with 1,3 benzenedithiol, but other ligand exchange compounds are compatible with an embodiment. When rubidium chloride (RbCl) is used for treatment of QDs by covering the QDs with the salt solution, FF was increased by 57%, $J_{sc}$ was increased by 48%, and $\eta_p$ was increased by 74% under AM1.5G illumination, compared to a control PV cell having QDs that were not treated with salt solution. Treatment with calcium chloride (CaCl$_2$) improves PV cell performance, but the improvement is less than that achieved by treatment with KCl. Other salts which were tested and showed improved power conversion compared to untreated QDs include lithium chloride (LiCl), sodium chloride (NaCl), ammonium chloride (NH$_4$Cl), potassium bromide (KBr), and potassium iodide (KI).

TABLE 1

Power conversion efficiency of PV cell embodiments

| Device | $V_{OC}$ (V) | $J_{SC}$ (mA/cm$^2$) | FF | $\eta_p$ (%) |
|---|---|---|---|---|
| KCl | 0.44 | 27 | 0.45 | 5.4 |
| CaCl$_2$ | 0.43 | 24 | 0.42 | 4.3 |
| BDT (control) | 0.62 ± 0.03 | 18.36 ± 1.67 | 0.37 ± 0.02 | 4.21 ± 0.11 |
| TBACl (Cl$^-$ only) | 0.38 ± 0.08 | 22.68 ± 2.29 | 0.42 ± 0.03 | 3.62 ± 0.28 |
| RbCl | 0.48 ± 0.04 | 26.54 ± 1.41 | 0.58 ± 0.02 | 7.32 ± 0.08 |

Figure 11:
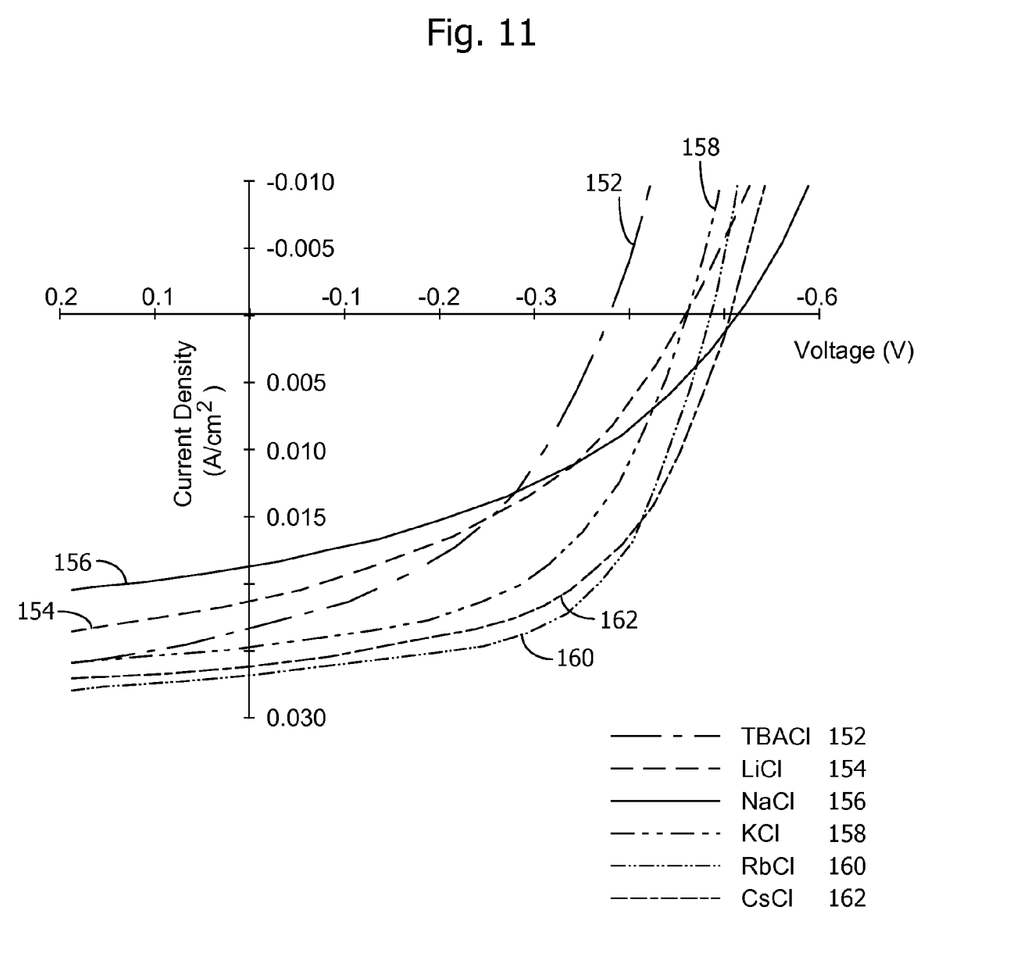
FIG. 11 is a graph of current density with respect to voltage for alternative embodiments using different salt compounds for salt treatment of QDs.
Figure 12:
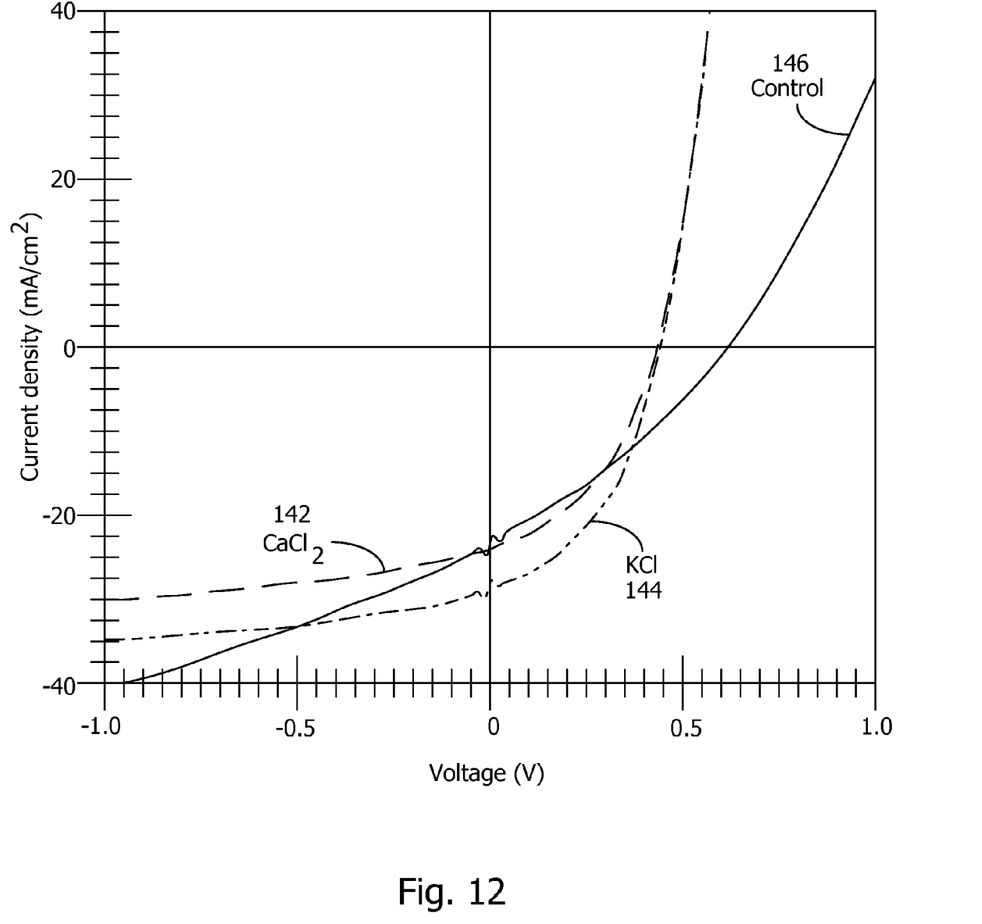
FIG. 12 is a graph comparing current and voltage output from a PV cell in accord with an embodiment in which QDs have been treated with a salt solution before ligand exchange, and further showing a comparison to a control (i.e., a reference case) manufactured without exposure to a salt solution.

As may be observed in Table 1, the highest power conversion efficiency measured was for rubidium chloride (RbCl). Alternative embodiments include the use of different salts, treatment times, spin speeds, and order of reagent application. For example, alternative embodiments comprise preparing the salt solution for repairing a QD film from at least one salt compound selected from the group of salt solutions consisting of lithium chloride (LiCl), sodium chloride (NaCl), potassium chloride (KCl), rubidium chloride (RbCl), caesium chloride (CsCl), calcium chloride (CaCl2), ammonium chloride (NH4Cl), tetrabutylammonium chloride (TBACl), tetramethylammonium chloride (TMACl), potassium iodide (KI), rubidium iodide (RbI), caesium iodide (CsI), tetrabutylammonium iodide (TBAI), tetramethylammonium iodide (TMAI), potassium bromide (KBr), tetrabutylammonium bromide (TBABr), tetramethylammonium bromide (TMABr) and ammomium fluoride (NH4F). FIG. 11 illustrates performance curves for different salts used for salt treatment of a QD layer, including TBACl 152, LiCl 154, NaCl 156, KCl 158, RbCl 160, and CsCl 162. FIG. 12 compares performance curves for calcium chloride (CaCl2) 142 and KCl 144 to a control 146 manufactured without salt treatment after deposition of QD films.

Figure 13:
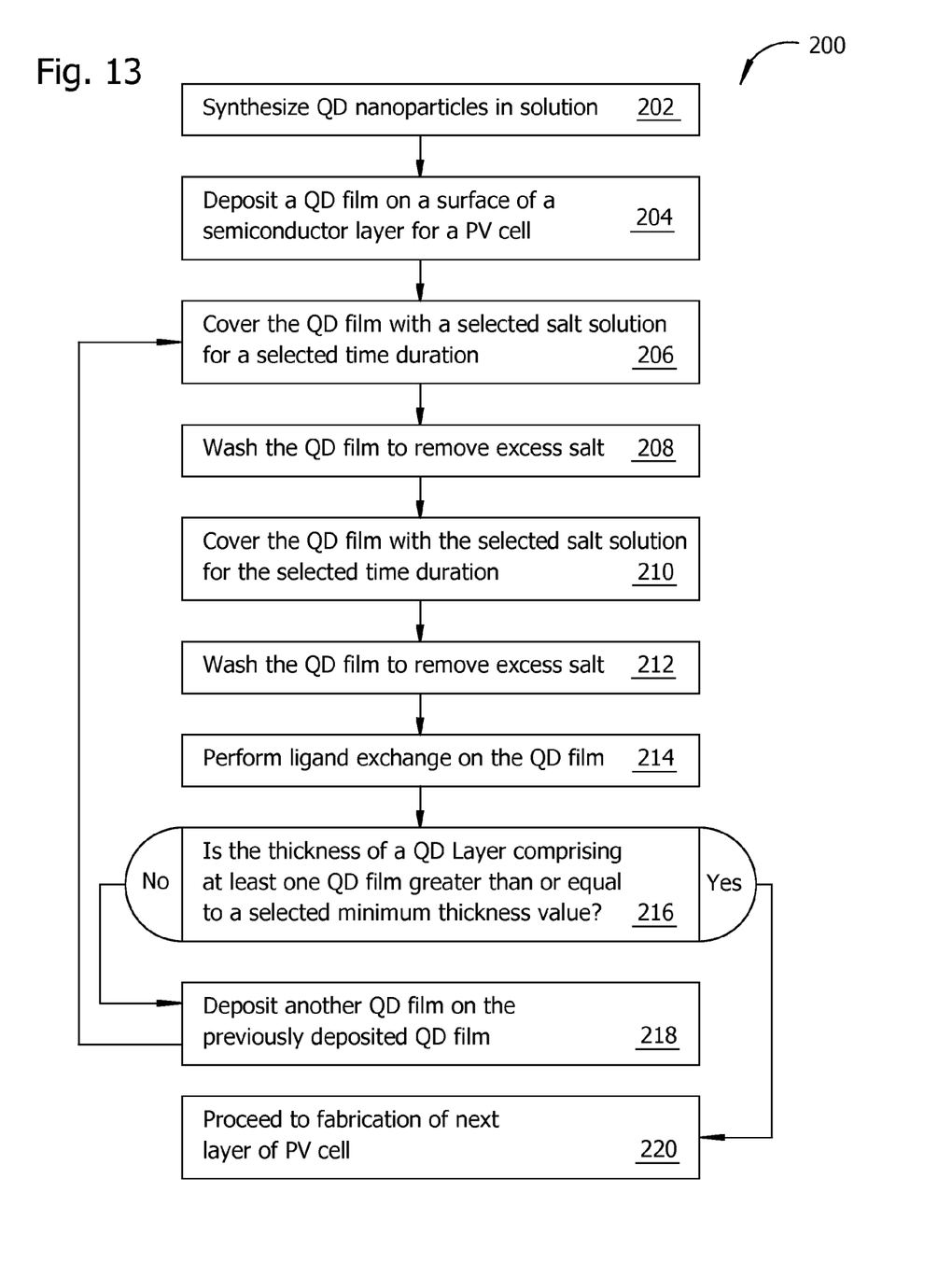
FIG. 13 is a block diagram representing examples of steps in a method embodiment.

FIG. 13 illustrates an example of steps in a method embodiment. The method embodiment 200 begins at block 202 with synthesis of QD particles in solution. Next, at block 204 a QD film is deposited on a surface of a semiconductor layer for a PV cell, for example an N-type semiconductor layer. After the deposition of a QD film is completed, the QD film is subjected to at least one salt treatment. In block 206, the QD film is covered with a selected salt solution for a selected time duration. The salt solution is preferably selected from the group of salt solutions described earlier. After the QD film has been exposed to the salt solution for the selected time duration, excess salt solution is removed from the QD film, optionally by washing the QD film as suggested in block 208.

After the first salt treatment, the QD film may optionally be subjected to a second salt treatment as shown in block 210. The second salt treatment concludes by removing excess salt solution from the QD film, optionally be washing the QD film as suggested in block 212.

In the example of FIG. 13, ligand exchange is performed on the QD film after salt treatment as shown in block 214. In alternative embodiments, ligand exchange may precede either one or both of the salt treatments.

After ligand exchange, a determination of the thickness dimension of a QD layer may be made and the QD layer thickness may be compared to a preferred value of thickness. As shown in block 216, when the thickness of a QD layer comprising at least one QD film is greater than or equal to a selected minimum thickness value, the method proceeds to fabrication of the next layer of the PV cell as suggested in block 220. When the QD layer is less than the selected minimum thickness value, another QD film is deposited on the previously deposited QD film as shown in block 218, and the method returns to block 206 to repeat salt treatments and ligand exchange.

Some of the operations described herein may be performed in a different order than implied by the sequence of blocks in FIG. 13. Such variations are considered to be within the scope of the disclosed embodiments.

Unless expressly stated otherwise herein, ordinary terms have their corresponding ordinary meanings within the respective contexts of their presentations, and ordinary terms of art have their corresponding regular meanings.

What is claimed is:

1. A method comprising:
    depositing a quantum dot film on a substrate layer of a photovoltaic cell;
    after depositing the quantum dot film, repairing a structural defects in the quantum dot film by treating the quantum dot film with a salt solution; and
    performing a ligand exchange on the quantum dot film.

2. The method of claim 1, wherein the treating the quantum dot film with a salt solution further comprises removing excess salt solution from the quantum dot film.

3. The method of claim 1, further comprising another salt treatment of the quantum dot film after the depositing the quantum dot film is completed and before a subsequent depositing of another quantum dot film.

4. The method of claim 1, wherein the treating the quantum dot film with a salt solution is performed exactly twice before a subsequent deposition of another quantum dot film.

5. The method of claim 1, further comprising repeating the depositing the quantum dot film, the treating the quantum dot film with the salt solution, and the performing the ligand exchange until a quantum dot layer is formed with a preferred thickness dimension.

6. The method of claim 1, further comprising repeating the depositing the quantum dot film, the treating the quantum dot film with the salt solution, and the performing the ligand exchange until a photovoltaic cell achieves a minimum preferred value of power conversion efficiency.

7. The method of claim 1, further comprising repeating the ligand exchange until a value for a short circuit current for the photovoltaic cell is greater than or equal to a selected minimum value of short circuit current.

8. The method of claim 1, further comprising forming the substrate layer from an N-type semiconductor material.

9. The method of claim 1, further comprising synthesizing quantum dots from lead sulfide.

10. The method of claim 1, further comprising synthesizing quantum dots from lead selenide.

11. The method of claim 1, further comprising forming the substrate layer from zinc oxide.

12. The method of claim 1, further comprising forming the substrate layer from titanium oxide.

13. The method of claim 1, further comprising preparing the salt solution from at least one salt compound selected from the group consisting of lithium chloride (LiCl), sodium chloride (NaCl), potassium chloride (KCl), rubidium chloride (RbCl), caesium chloride (CsCl), calcium chloride ($CaCl_2$), ammonium chloride ($NH_4Cl$), tetrabutylammonium chloride (TBACl), tetra methylammonium chloride (TMACl), potassium iodide (KI), rubidium iodide (RbI), caesium iodide (CsI), tetrabutylammonium iodide (TBAI), tetramethylammonium iodide (TMAI), potassium bromide (KBr), tetrabutylammonium bromide (TBABr), tetramethylammonium bromide (TMABr), and ammonium fluoride ($NH_4F$).

14. The method of claim 1, further comprising covering the plurality of quantum dots with the salt solution before performing the ligand exchange.

15. The method of claim 1, further comprising performing the ligand exchange before covering the plurality of quantum dots with the salt solution.

16. A photovoltaic cell for generating electrical power, comprising:
    a first transparent outer layer;
    a first electrode adjacent the first transparent outer layer;
    a transparent semiconductor layer electrically connected to the first electrode;
    a quantum dot layer forming a P-N junction with the transparent semiconductor layer, the quantum dot layer comprising at least one quantum dot film modified by washing the at least one quantum dot film with a salt solution and by ligand exchange;
    a second outer layer; and
    an interfacial layer between the quantum dot layer and the second outer layer.

17. The photovoltaic cell of claim 16, wherein the quantum dot layer further comprises a plurality of quantum dot films and each of the plurality of quantum dot films is modified by washing with a salt solution and by ligand exchange before another of the plurality of quantum dot films is deposited.

18. The photovoltaic cell of claim 16, wherein the quantum dots are modified by ligand exchange until the photo voltaic cell has a selected minimum value of power conversion efficiency.

19. The photovoltaic cell of claim 16, wherein the first electrode comprises indium tin oxide (ITO) formed as a layer transparent to visible light.

20. The photovoltaic cell of claim 16, wherein the photo voltaic cell has a power conversion efficiency of at least four percent.

21. A photovoltaic cell manufactured by the process of:
    synthesizing a solution of quantum dots stabilized by long-chain ligands;
    depositing a quantum dot film on a transparent semiconductor layer;
    repairing defects in the quantum dot film by exactly two salt treatments of the quantum dot film; and
    performing ligand exchange on the quantum dot film,
    wherein each of the exactly two salt treatments comprises:
        covering the quantum dot film with a salt solution for a selected time duration; and
        removing excess salt solution from the quantum dot film.

22. The photo voltaic cell manufactured by the process of claim 21, further comprising depositing a plurality of the quantum dot film until a quantum dot layer having a preferred thickness dimension is formed, wherein exactly two salt treatments and ligand exchange are performed on each of the plurality of the quantum dot film before a subsequent quantum dot film deposition.

* * * * *